United States Patent
Lee

(10) Patent No.: US 8,289,054 B2
(45) Date of Patent: Oct. 16, 2012

(54) HIGH VOLTAGE DIFFERENTIAL PAIR AND OP AMP IN LOW VOLTAGE PROCESS

(75) Inventor: Edward K. F. Lee, Fullerton, CA (US)

(73) Assignee: Alfred E. Mann Foundation For Scientific Research, Santa Clarita, CA (US)

( * ) Notice: Subject to any disclaimer, the term of this patent is extended or adjusted under 35 U.S.C. 154(b) by 12 days.

(21) Appl. No.: 12/881,165

(22) Filed: Sep. 13, 2010

(65) Prior Publication Data

US 2011/0050318 A1   Mar. 3, 2011

Related U.S. Application Data

(63) Continuation-in-part of application No. 12/869,442, filed on Aug. 26, 2010.

(60) Provisional application No. 61/237,239, filed on Aug. 26, 2009.

(51) Int. Cl.
    *H03K 5/22*   (2006.01)

(52) U.S. Cl. ............................ 327/65; 327/52

(58) Field of Classification Search ................ 327/65
    See application file for complete search history.

(56) References Cited

U.S. PATENT DOCUMENTS

| 5,805,021 | A  | * | 9/1998  | Brehmer   | 330/253 |
| 6,300,833 | B1 | * | 10/2001 | Vyne et al. | 330/257 |
| 6,445,218 | B1 | * | 9/2002  | Lee       | 327/65  |
| 7,304,506 | B2 | * | 12/2007 | Hangaishi | 326/87  |
| 7,635,995 | B2 | * | 12/2009 | Kunc et al. | 327/65 |

* cited by examiner

*Primary Examiner* — Hai L Nguyen
(74) *Attorney, Agent, or Firm* — Oleh J. Zajac

(57) ABSTRACT

A high voltage differential pair and op amp implemented in a low voltage semiconductor process. The high voltage differential pair expands the incoming common mode voltage of a differential pair to multiple times the normal operating voltage of the differential pair through the use of high voltage current sources, current sinks and stacks of transistors. The high voltage op amp includes a high voltage input stage and a high voltage common source amplifier to expand the output voltage range to multiple times the normal operating voltage of the op amp.

6 Claims, 11 Drawing Sheets

US 8,289,054 B2

HIGH VOLTAGE DIFFERENTIAL PAIR AND OP AMP IN LOW VOLTAGE PROCESS

CROSS REFERENCE TO RELATED APPLICATIONS

This application is a continuation in part of patent application Ser. No. 12/869,442 filed on Aug. 26, 2010, which claims the benefit under 35 USC 119(e) of provisional patent application Ser. No. 61/237,239, which was filed on Aug. 26, 2009, and both of which are hereby incorporated by reference.

FIELD OF THE INVENTION

The invention relates to semiconductor circuits, and more specifically to a high voltage differential pair and op amp implemented in a low voltage semiconductor process.

BACKGROUND OF THE INVENTION

Advanced integrated circuit fabrication processes, such as CMOS can produce chips with low power consumption, high logic density and high speed of operation. However, these modern processes manufacture integrated circuits that operate at low voltages, due to the lowered breakdown voltages of the transistors that are fabricated. These low voltage IC's are difficult to interface with circuits operating at higher voltage levels, unless special processes are used that can produce low voltage and high voltage devices in the same IC, but these special processes can have disadvantages such as limited performance capabilities.

One particular area of technology using low voltage ICs, but required to interface to higher voltage circuits is implantable medical devices for the purpose of functional electrical stimulation (FES). Such devises stimulate nerve bundles with electrodes in close proximity to the nerve tissue.

A differential pair is a very important circuit in the design of many analog circuits, such as for example, operational amplifiers (op amps) or differential amplifiers. Differential pairs are used as the front end input stage of op amps. The ability to process high voltage signals using high voltage tolerant circuits such as differential pairs and op amps, with integrated circuits built using low voltage advanced CMOS processes, is highly desirable.

SUMMARY OF THE INVENTION

A high voltage differential pair and op amp implemented in a low voltage semiconductor process. The high voltage differential pair expands the incoming common mode voltage of a differential pair to multiple times the normal operating voltage of the differential pair through the use of high voltage current sources, current sinks and stacks of transistors. The high voltage op amp includes a high voltage input stage and a high voltage common source amplifier to expand the output voltage range to multiple times the normal operating voltage of the op amp.

DETAILED DESCRIPTION

Figure 1:
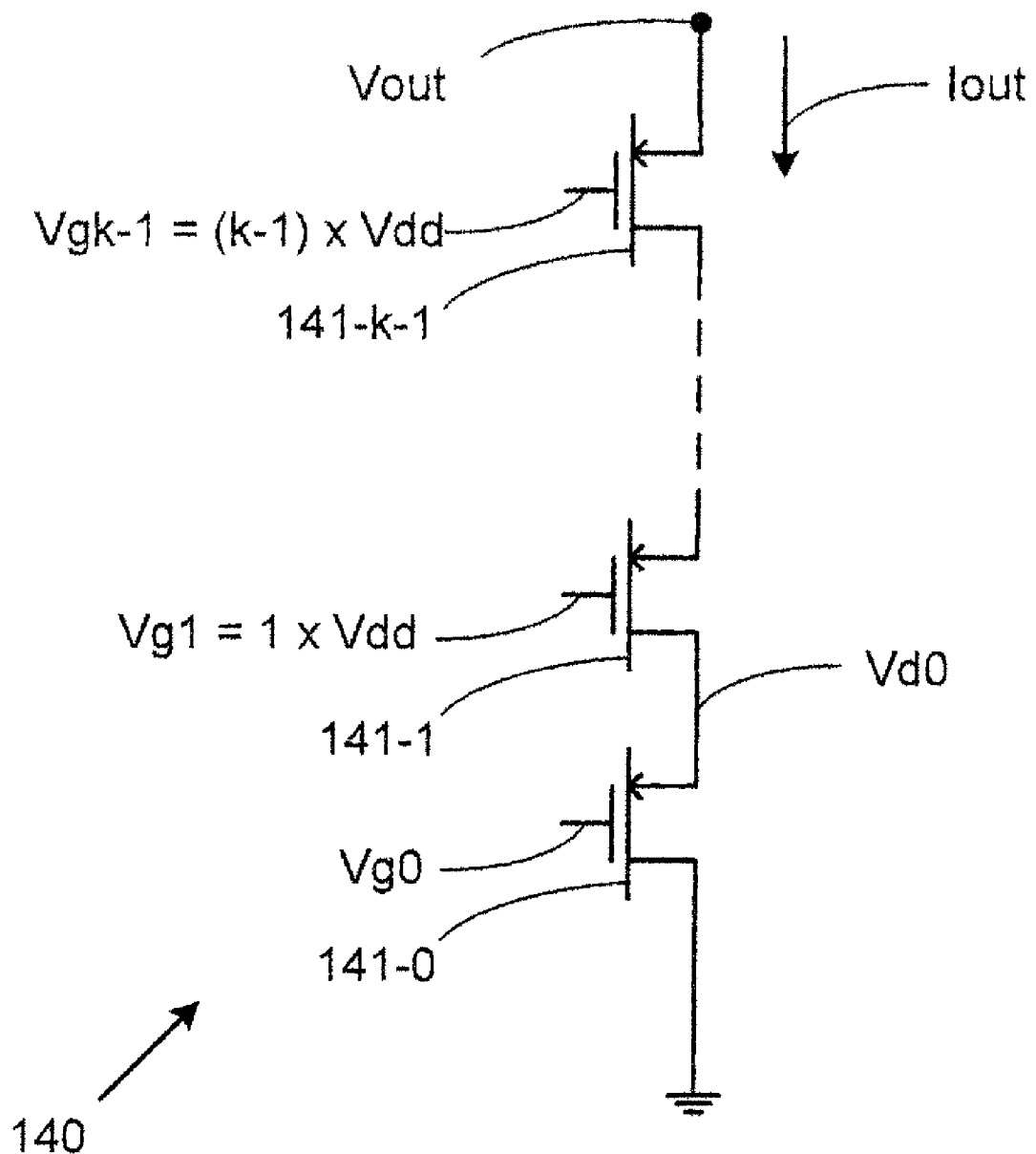
FIG. 1 shows a circuit diagram of a high voltage current source.

FIG. 1 shows a circuit diagram of a high voltage current source 100. In order to design high voltage (HV) circuits in a low voltage CMOS process, a common way is to connect a number k of transistors 141-0 to 141-(k−1) in series as shown in FIG. 1. Transistor 141-0 sets the output current for current source 140 and transistors 141-1 to 141-(k−1) are a stack of (k−1) transistors. The gate voltage Vg0 applied to transistor 141-0 determines the output current of current source 140. In this case, a simple high voltage current sink 100 is realized. The gate voltages of the stacked transistors 141-1 to 141-(k−1), Vg1, . . . , Vgk-1 are fixed accordingly such that all Vds's are less than 1×Vdd and approximately equal to (Vout−Vdo)/k, where k is the number of transistors in series and Vdo is the drain voltage of transistor 141-0. However, the voltage at the output Vout can only swing within 1×Vdd and cannot reach close to ground without exceeding the voltage breakdown limits of individual transistors in the stack. Nevertheless, a simple high voltage source, but with very limited capabilities can be designed using a different polarity of transistors.

Figure 2:
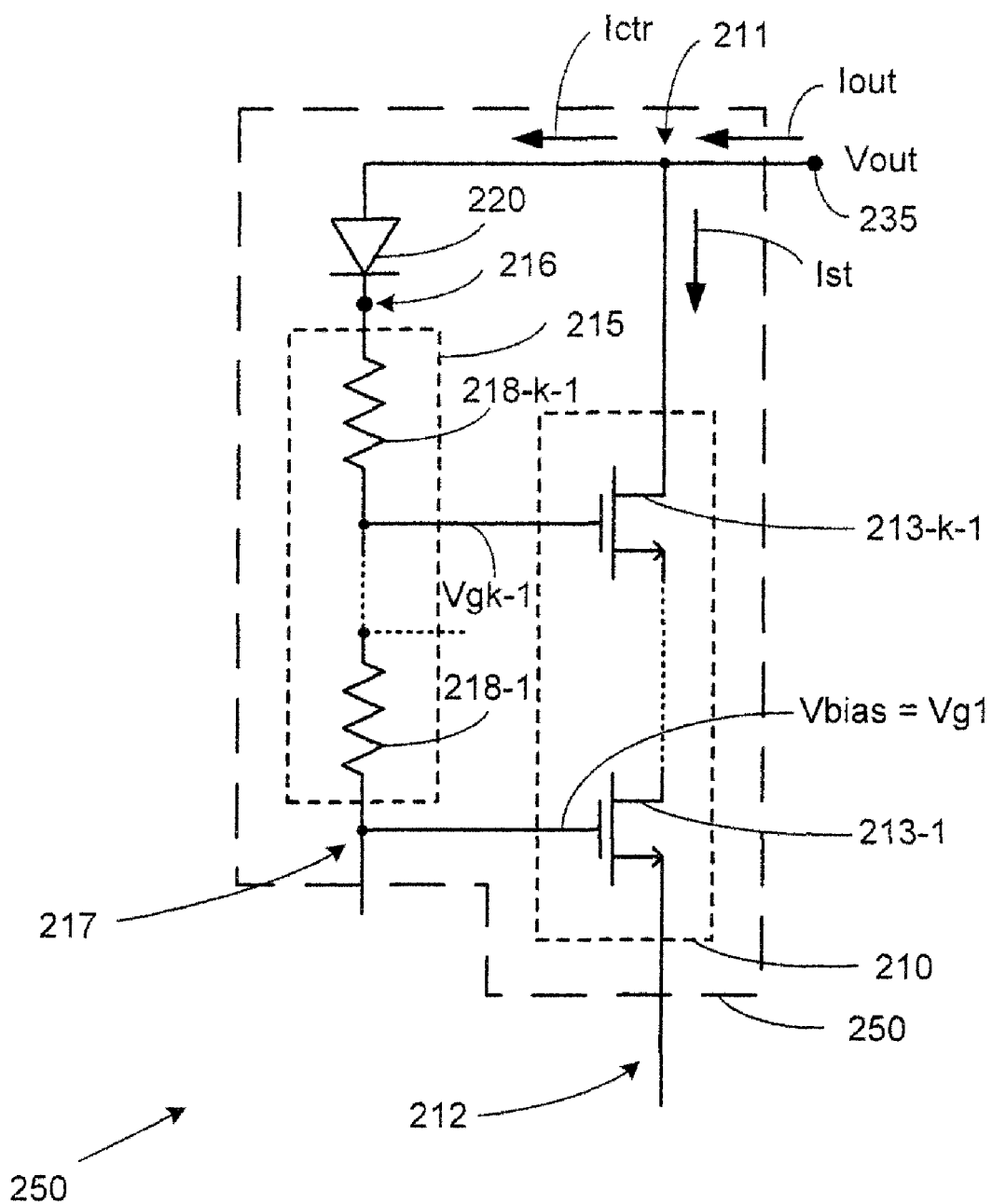
FIG. 2 shows a circuit diagram of a voltage expander.

FIG. 2 shows a circuit diagram of voltage expander 250 with wide voltage swing, according to an embodiment of the present invention. The voltage expander 250 can extend the voltage swing at the output node 235, which has a typical voltage swing of 1×Vdd at node 212 to about 0V to k-1 times Vdd at the output 235 of voltage expander 250. Similar to the circuit in FIG. 1, voltage expander 250 also utilizes a number (k−1) of stacked transistors 210, i.e., 213-1 to 213-k-1. However, the gate voltages Vg1 to Vgk-1 of the stack of transistors 210 depend on the output voltage Vout at node 235 instead of having fixed gate voltage levels or depending on the input voltage, as is known to those skilled in the art. The gate voltages Vg1 to Vgk-1 are generated by voltage divider 215 together with a series diode 220 in a diode 220 and voltage divider 215 arrangement that couples between the output 235 of the voltage expander 250 and the bias voltage Vbias at node 217. Vbias is set at about 1×Vdd. Diode 220 blocks the flow of current from voltage divider 215 back to the output terminal 235.

In this arrangement, the gate voltages Vg1 to Vgk-1 of the stacked transistors 213-1 to 213-k-1 can be written as $$Vgj = Vbias + \frac{\sum_{m=1}^{j} R_m}{\sum_{i=1}^{k-1} R_i}(Vout - Vd - Vbias) \text{ for } Vout > Vbias + Vdiode \quad (1)$$

$$Vgj = Vbias \text{ for } Vout < Vbias + Vdiode \quad (2)$$

where Vdiode is the diode voltage drop. As shown in equation 1, the gate voltages Vgj are linearly proportional to the output voltage for Vout>Vbias+Vdiode and the stacked transistors 210 are operating in the saturation region. When Vout<Vbias+Vdiode, all the gate voltages Vgj are equal to Vbias and the stacked transistors 210 are operating in the triode region. Nevertheless, stacked transistors 210 still remain in the ON state, which is an important feature that allows the output voltage Vout to swing below 1×Vdd.

If the stacked transistors 210 were, instead, in the OFF state, no current would be allowed to flow through the stack of transistors 210 for pulling down the output voltage Vout below 1×Vdd and, hence the output swing will be limited. By operating the stack of transistors 210 in different regions according to the output voltage Vout, it allows the voltage swing at node 212 to be extended from about 1×Vdd to k-1×Vdd with all the transistors operating under their voltage breakdown limits.

Note that the output current of the voltage expander 250 is equal to the current flow through the stacked transistors 210, Ist, and the current flow through the diode 220 and voltage divider 215 arrangement, Ictr, which can be expressed as $$Ictr = (Vout - Vd - Vbias) / \sum_{i=1}^{k-1} R_i \text{ for } Vout > Vbias + Vdiode \quad (3)$$

$$Ictr = 0 \text{ for } Vout < Vbias + Vdiode \quad (4)$$

Hence, Ictr is also linearly proportional to Vout. The linearity of Ictr with respect to the output voltage is an important feature for using the voltage expander 250 for various linear applications.

Figure 3:
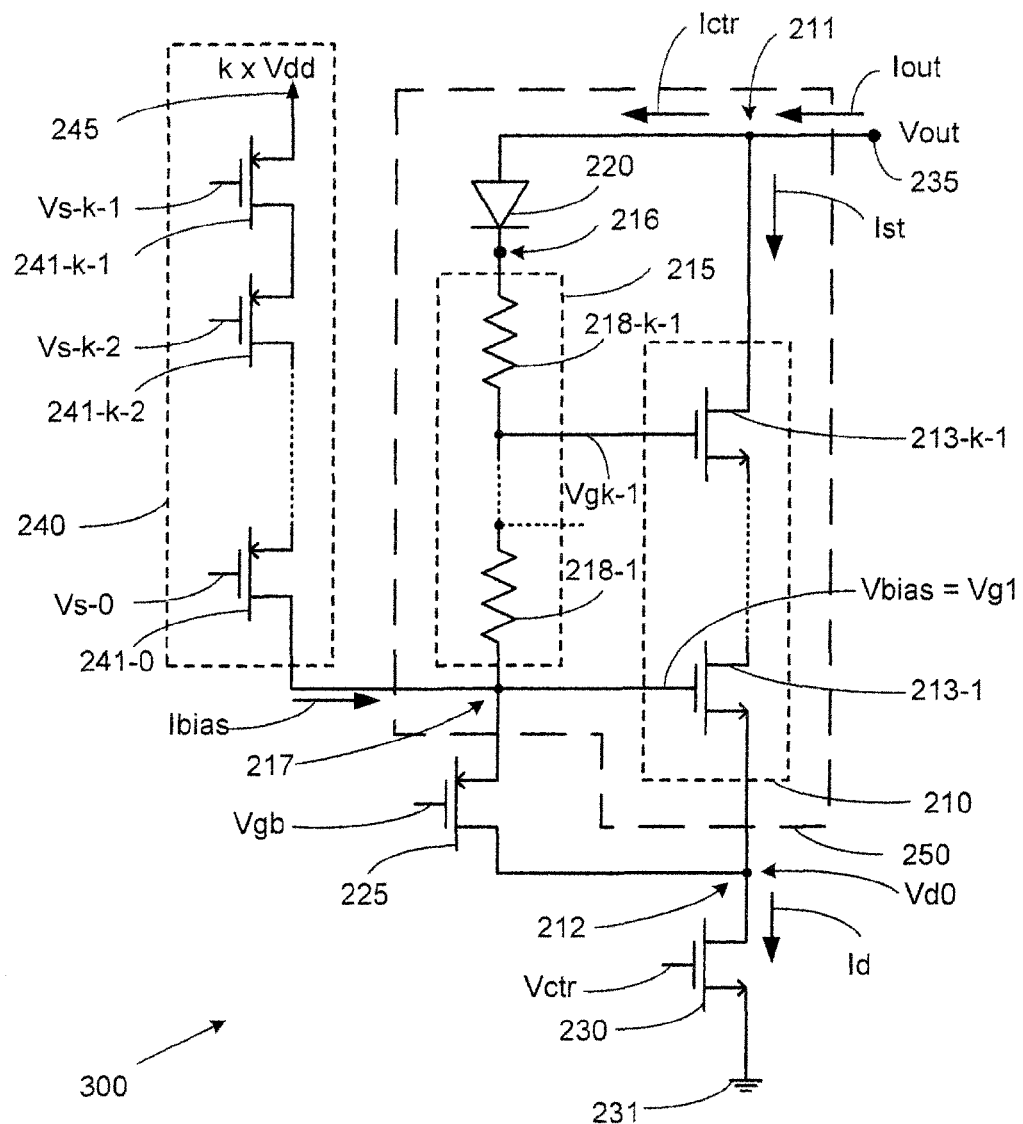
FIG. 3 shows a circuit diagram of a high voltage wide swing current sink.

FIG. 3 shows a circuit diagram of a high voltage wide swing current sink 300 according to an embodiment of the present invention. Current sink 300 includes voltage extender 250, transistors 230 and 225 and current sink 240. A current sink can be considered a current source that absorbs electrical current. Using voltage expander 250 including transistor stack 210, a high voltage wide swing current sink 300 is shown in FIG. 3. Two transistors 225 and 230 are added to voltage expander 250 and the current sink 300 can have a voltage swing from about 0V to k×Vdd. For Vout>Vbias+Vdiode, transistor 230 defines the total current at the output 235 of the voltage expander, Iout. Transistor 225 is used for transferring the current flow through the diode 220 and voltage divider 215 arrangement (Ictr) to the drain of transistor 230, Id, such that Id is equal to Ictr+Ist and hence, is equal to Iout. The gate voltage of transistor 225, Vgb, is set to a value such that Vbias is equal to about 1×Vdd. The gate voltage Vgb of transistor 225 sets the voltage of the second terminal 217 of voltage divider 215. For Vout<Vbias+Vdiode, transistor 225 will operate in the cut-off region and Vbias may not be well defined. To prevent this from happening, a simple high voltage current source 240 with a value of Ibias is coupled to Vbias such that there is always current flow through transistor 225 even when Vout<Vbias+Vdiode and Ictr=0. In this case, the total drain current of transistor 230, Id, is equal to Ibias+Ictr+Ist. Since the output current at the voltage expander 250, Iout, is equal to Ictr+Ist, the output current of the high voltage wide swing current sink 300 is always constant and equal to Id−Ibias for the entire voltage range between about 0V and k×Vdd when Ibias is added. Current source 240 includes transistor 240-0 and a stack of (k−1) transistors 241-1 to 241-k-1 with gate voltages Vs-1 to Vs-k and connected to voltage supply k×Vdd at terminal 245. The gate voltage Vs-0 controls the output current for current source 240.

In alternate embodiments, the voltage expander 250 and the high voltage current sink 300, can be made of bipolar junction transistors. In all of these various operational configurations, the voltages across the different terminals of all the transistors are less than the breakdown voltage of any of the transistors.

Figure 3A:
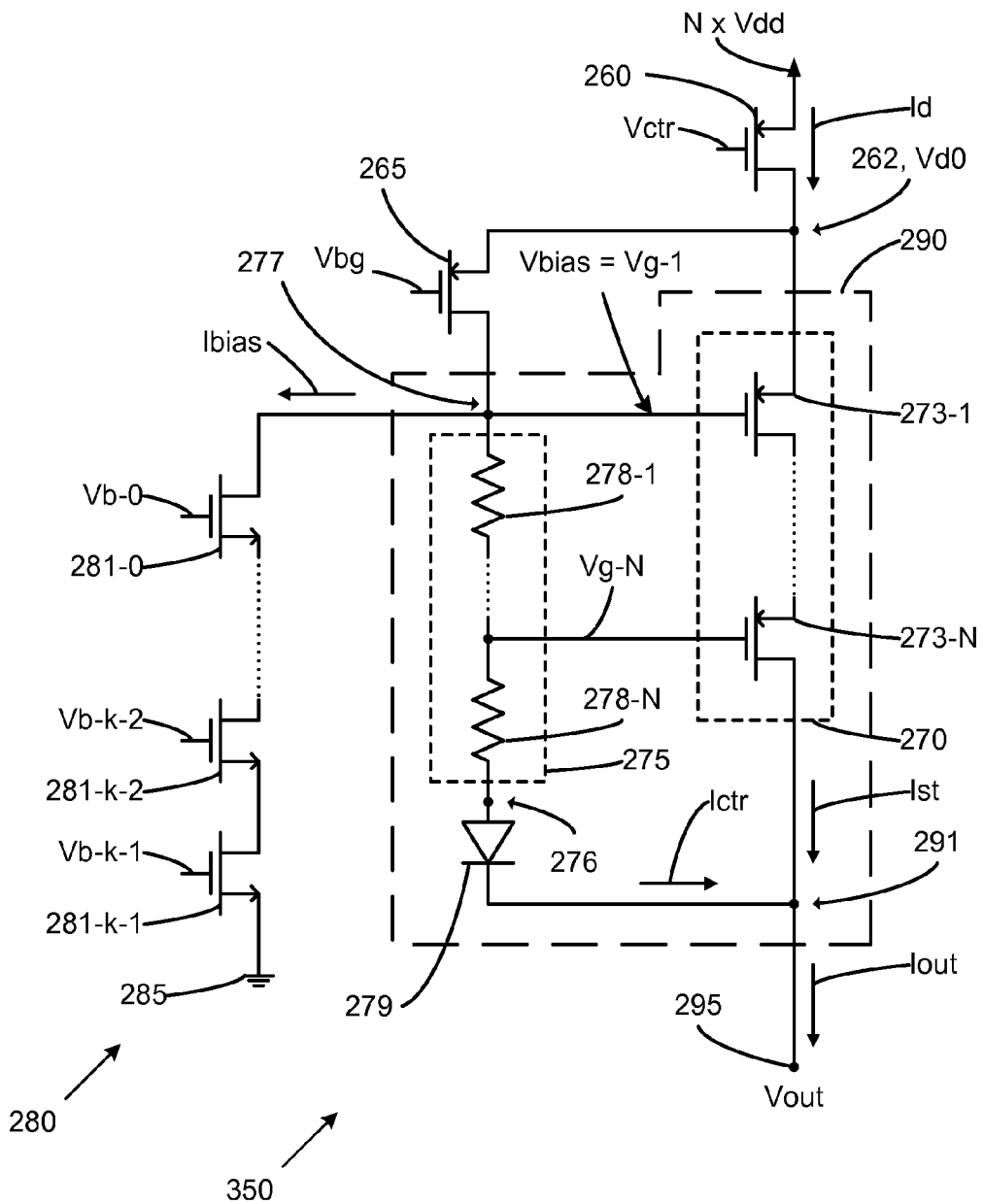
FIG. 3A shows a circuit diagram of a high voltage wide swing current source.

FIG. 3A shows a circuit diagram of a high voltage wide swing current source 350. Current source 350 includes voltage expander 290, transistors 260 and 265 and current sink 280. A current sink can be considered a current source that absorbs electrical current. Using voltage expander 290, a high voltage wide swing current source 350 is shown in FIG. 3A. Two transistors 260 and 265 are added to voltage expander 290 and the current source 350 can have a voltage swing from 0V to about N×Vdd. For Vout>Vbias+Vdiode, transistor 260 defines the total current at the output 295 of the voltage expander, Iout. Transistor 265 is used for transferring the current flow through the diode 280 and voltage divider 275 arrangement (Ictr) to the drain of transistor 260, Id, such that Id is equal to Ictr+Ist and hence, is equal to Iout. The gate voltage of transistor 265, Vgb, is set to a value such that Vbias is equal to about 1×Vdd. The gate voltage Vgb of transistor 265 sets the voltage of the second terminal 277 of voltage divider 275. For Vout<Vbias+Vdiode, transistor 265 will operate in the cut-off region and Vbias may not be well defined. To prevent this from happening, a simple high voltage current sink 280 with a value of Ibias is coupled to Vbias such that there is always current flow through transistor 265 even when Vout<Vbias+Vdiode and Ictr=0. In this case, the total drain current of transistor 260, Id, is equal to Ibias+Ictr+Ist. Since the output current at the voltage expander 290, Iout, is equal to Ictr+Ist, the output current of the high voltage wide swing current source 350 is always constant and equal to Id−Ibias for the entire voltage range between 0V and about N×Vdd when Ibias is added. Current sink 280 includes transistor 281-0 and a stack of (k−1) transistors 281-1 to 281-k-1 with gate voltages Vb-1 to Vb-k and is connected to ground at terminal 285. The gate voltage Vb-0 controls the input current absorbed by current sink 280.

In alternate embodiments, the voltage expander 290 and the high voltage current source 350, can be made of bipolar junction transistors. In all of these various operational configurations, the voltages across the different terminals of all the transistors are less than the breakdown voltage of any of the transistors.

Figure 4:
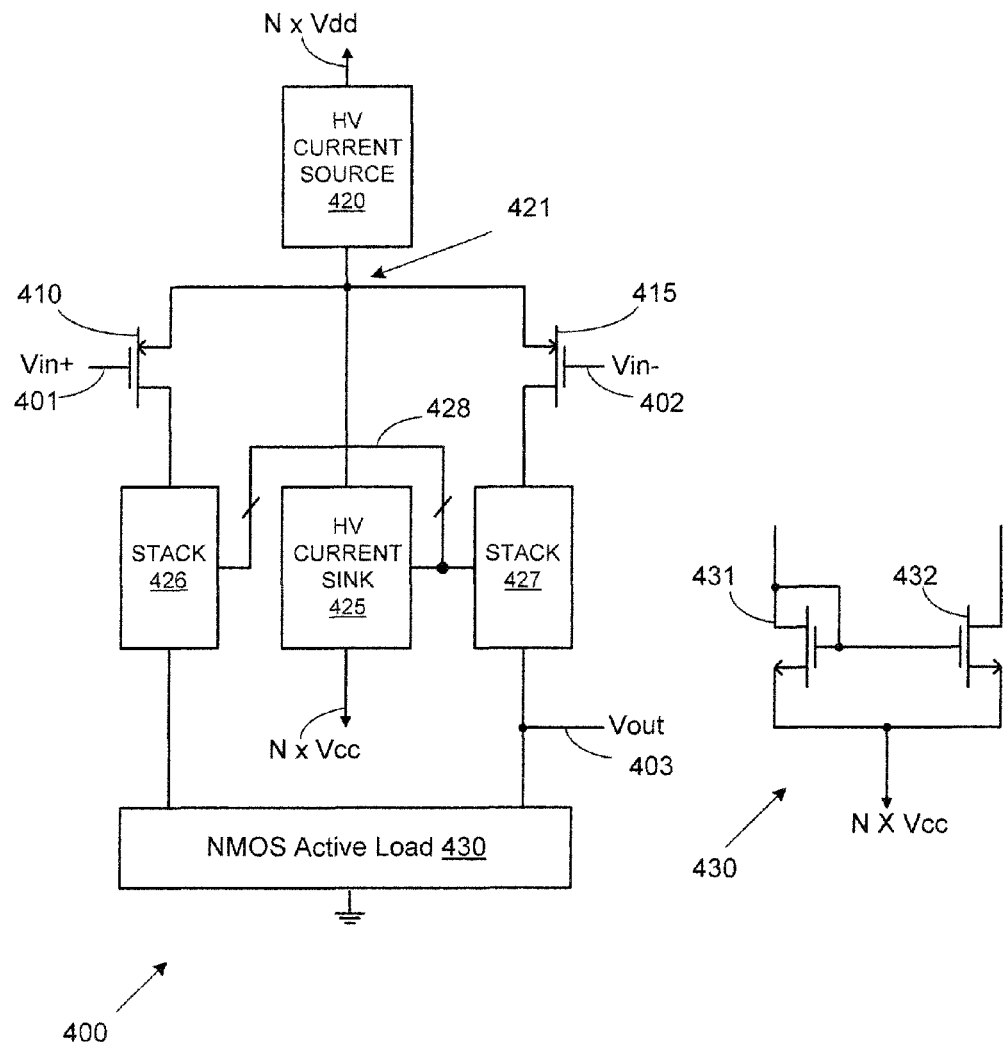
FIG. 4 shows a circuit diagram of a high voltage differential pair implemented in a low voltage process according to an embodiment of the present invention.

FIG. 4 shows a circuit diagram of high voltage (HV) differential pair 400 implemented in a low voltage process according to an embodiment of the present invention. HV differential pair 400 includes input transistors 410 and 415, current source 420, current sink 425 and transistor stacks 426 and 427. Differential pair 400 has differential inputs 401 and 402 and is coupled to NMOS active load 430 to generate an output at terminal 403. Supply voltage N×Vdd provides power to HV differential pair 400, where Vdd is the normal operating voltage for transistors 410 and 415. Transistor stacks 426 and 427 are similar to transistor stack 210 in FIG. 2 and each stack includes N transistors. Current source 420 and current sink 425 are HV current sources/sinks respectively similar to current source 350 in FIG. 3A and current sink 300 in FIG. 3 and each include N transistors in their internal stacks in series with a respective current controlling transistor. Current source 420 and current sink 425 also include a diode and voltage divider configuration similar to diode 220 and voltage divider 215 shown in FIG. 3. The diode and voltage divider internal to each of current source 420 and current sink 425 each generate N control voltages that are connected to the gates of the N transistors in their respective internal transistor stacks. Transistor stacks 426 and 427 expand the operating voltage range of the outputs of differential pair transistors 410 and 415 to multiple times the breakdown voltage of the transistors 410 and 415, without exceeding the breakdown voltages of the transistors.

The input common mode voltage (ICMV) cannot normally be greater than the breakdown voltage of the transistors in a differential pair. The present invention provides an innovative circuit design to build HV differential pairs using a low voltage process to enable such differential pairs to process input signals with an ICMV greater than the breakdown voltage of the transistors in the differential pair without causing the breakdown of any of the transistors.

For high voltage applications where the input common mode voltage (ICMV) range of the differential pair 400 can go rail-to-rail up to the high voltage supply rail, such as N×Vdd, with Vdd being the normal operating voltage, and where N=the number of series connected transistors in the stacks internal to current source 420, current sink 425 and also stacks 426 and 427. FIG. 4 illustrates HV differential pair 400 built using a low voltage CMOS process and without exceeding the low voltage breakdown voltages of the differential pair transistors 410 and 415, while amplifying a differential input signal with a high common mode range. To achieve HV operation, the tail current of differential pair 400 is realized using a PMOS high voltage current source 420, which is similar to current source 350 as shown in FIG. 3A. Current source 420 internally includes circuits which are equivalent to the series combination of a voltage divider (similar to 275 in FIG. 3A) and a diode (similar to 279 in FIG. 3A) in a configuration that controls a stack of transistors (similar to a stack including transistors 260 and 270 in FIG. 3A). The constant current output of current source 420 is determined by the last transistor in the stack (similar to transistor 260 in FIG. 3A) and its gate bias voltage. The drain terminals of the input transistors 410 and 415 are coupled to NMOS active load 430 as shown in FIG. 4, or to a passive load in other embodiments. NMOS Active load 430 includes NMOS transistor 431 configured as a diode and NMOS transistor 432.

If a differential pair of transistors 410 and 415 were directly connected to active load 430, an input signal with a wide input common mode voltage (ICMV) range could exceed the breakdown voltage of transistors 410 and 415. To achieve HV operation, two stacks 426 and 427 of PMOS transistors, are connected to the drain terminals of input transistors 410 and 415 and through bus 428 to a diode and voltage divider configuration within current sink 425. Stacks 426 and 427 are similar to transistor stack 210 in voltage extender 250 in FIG. 2. For circuit 400 to safely accommodate a supply voltage of N×Vdd and a wide range ICMV, N is the number of transistors in each of stacks 426 and 427. The N gate voltages of the N transistors in stacks 426 and 427 are controlled by N output voltages of a voltage divider and diode configured inside high voltage current sink 425, which is similar to current sink 300 in FIG. 3. The voltage divider/diode configuration in current sink 425 is similar to voltage divider 215 and diode 220 as shown in FIG. 3. Current sink 425 follows the input common mode voltage change by following the voltage changes on the source terminals of the differential pair input transistors 410 and 415 at common source node 421. Since current sink 425 follows the ICMV at common source node 421, the diode and voltage divider configuration within current sink 425 can generate the N control voltages that are connected to the gates of the transistors in the stack within current sink 425 and stacks 426 and 427. The generated gate control voltages for the transistor stacks ensure that the voltage across each transistor in the stack does not exceed the breakdown voltage of each respective transistor, as discussed with regard to FIGS. 2 and 3.

The bias current that flows through each input transistor 410 and 415 is equal to the current flow from current source 420 minus the current flow through current sink 425 divided by half. These bias currents do not change with the input common mode voltage as long as current source 420 and current sink 425 maintain proper operation for the input common mode voltage range. Input transistors 410 and 415 in differential pair 400 will function properly with a high voltage ICMV without exceeding their respective breakdown voltages.

Figure 5:
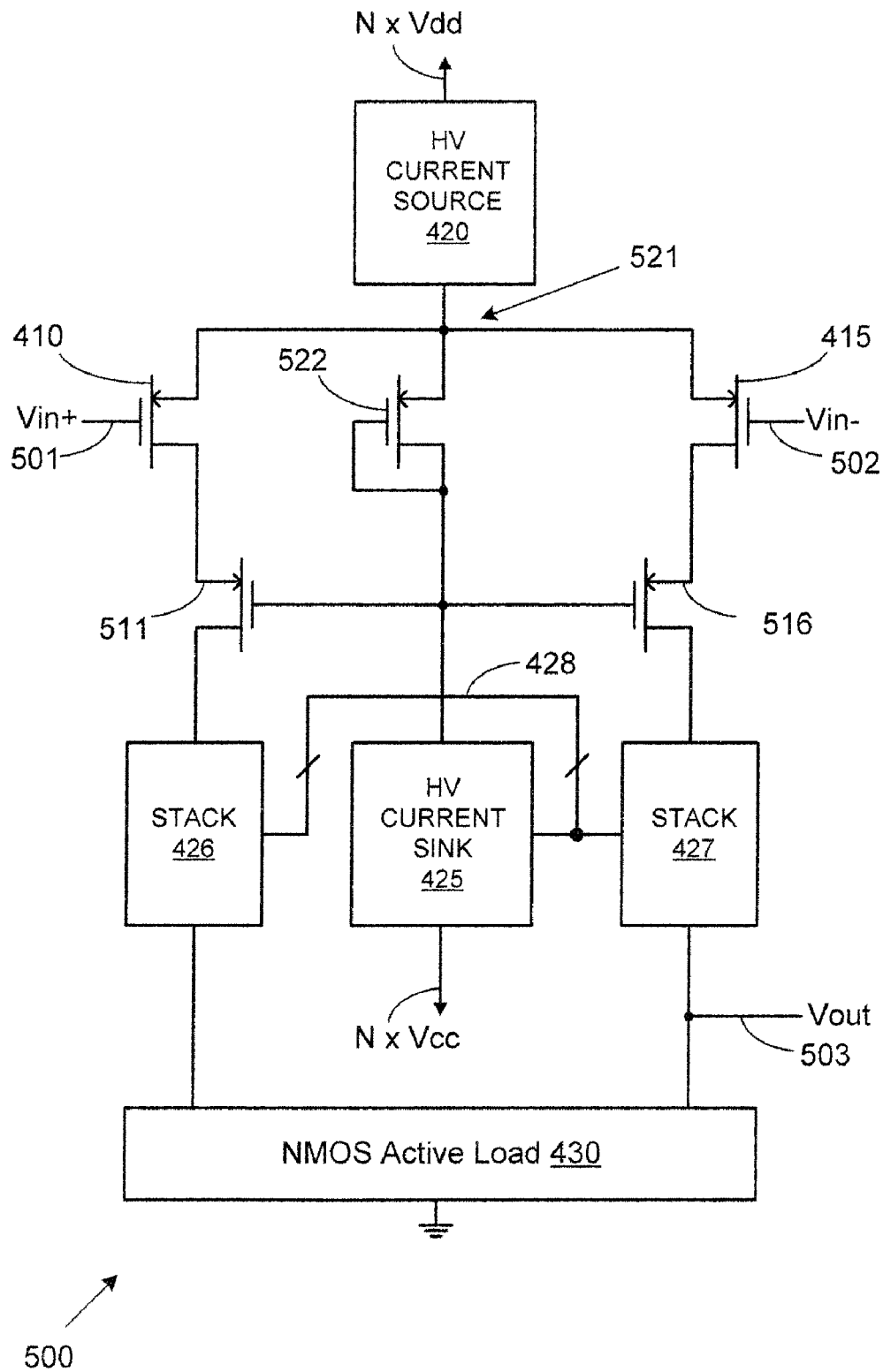
FIG. 5 shows a circuit diagram of a high voltage differential pair implemented in a low voltage process with cascode transistors according to an alternate embodiment of the present invention.

FIG. 5 shows a circuit diagram of a high voltage differential pair 500 implemented in a low voltage process according to an alternate embodiment of the present invention. HV differential pair 500 includes PMOS input transistors 410 and 415, NMOS cascode transistors 511 and 516, diode 522, current source 420, current sink 425 and transistor stacks 426 and 427. Differential pair 500 has differential inputs 501 and 502 and is coupled to NMOS active load 430 to generate an output voltage at terminal 503. As has been discussed with respect to FIG. 4, bus 428 connects the N control voltages generated by a diode and voltage divider configuration within current sink 425 to the respective gates of the N transistors in stacks 426 and 427, thus enabling differential pair 500 to withstand a HV ICMV without exceeding the breakdown voltage of any of the transistors in stacks 426 and 427.

The N transistors in stacks 426 and 427 in differential pair 400 of FIG. 4 provide differential pair 400 with the ability to handle a high ICMV, but do not increase the output impedances of input transistors 410 and 415. To increase the output impedance of input transistors 410 and 415, a pair of cascode transistors 511 and 516 is added at the drain terminals of input transistors 410 and 415 as shown in FIG. 5. A diode connected PMOS transistor 522 is connected between the source terminals of input transistors 410 and 415 and the gate terminals of the cascode transistors 511 and 516. Diode 522 provides a constant bias voltage (relative to the input common mode voltage) to cascode transistors 511 and 516. Current sink 425 follows the changes in ICMV at common source node 521.

As was discussed with respect to FIG. 4, the voltages across all of the transistors in differential pair 500 are protected from exceeding their respective breakdown voltages even when the ICMV approaches a high voltage supply voltage, which is multiple times larger than the breakdown voltage of the transistors in differential pair 500.

Figure 6:
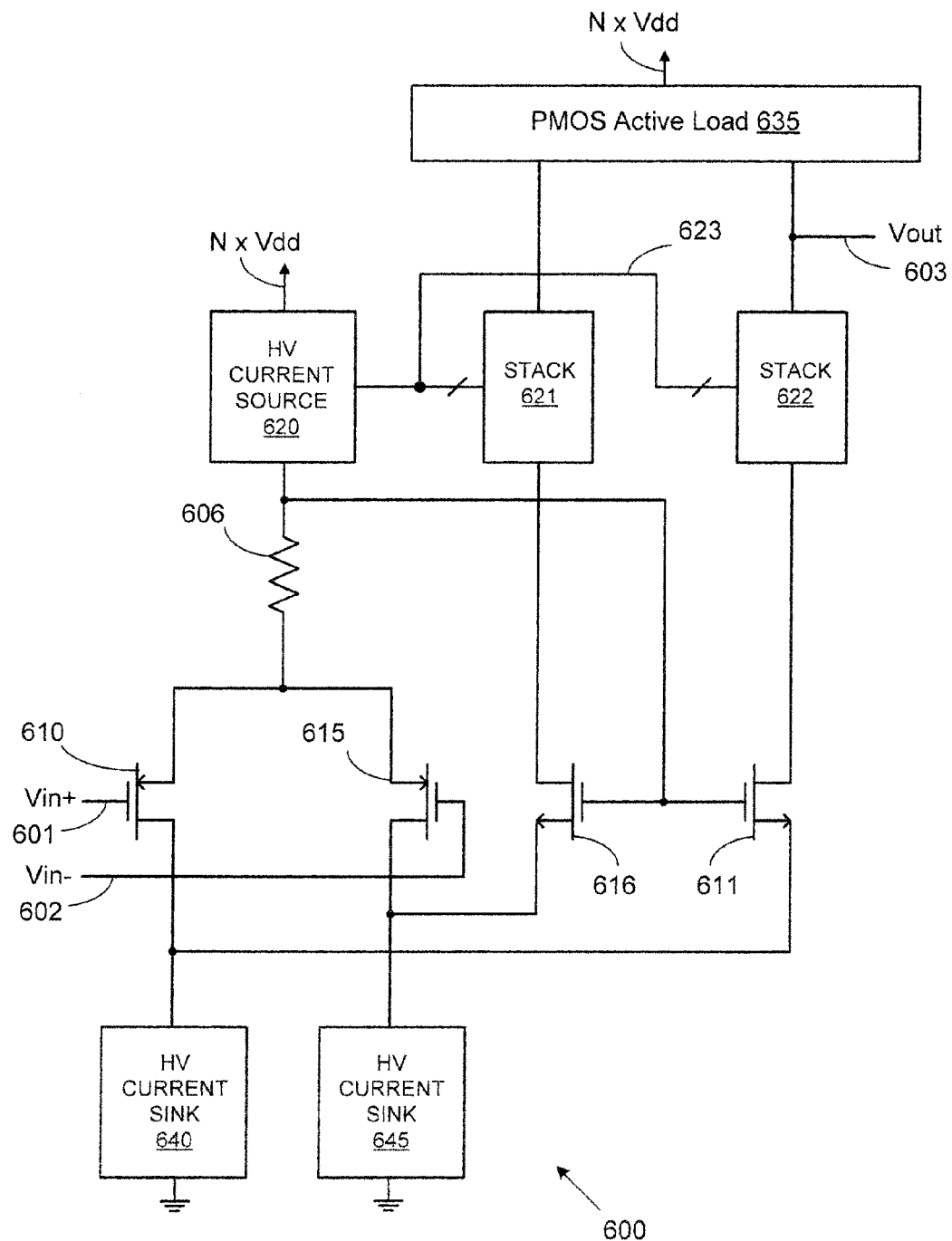
FIG. 6 shows a circuit diagram of a high voltage differential pair implemented in a low voltage process with folded cascode transistors according to another embodiment of the present invention.

FIG. 6 shows a circuit diagram of high voltage differential pair 600 implemented in a low voltage process according to another embodiment of the present invention. HV differential pair 600 includes PMOS input transistors 610 and 615, folded cascode NMOS transistors 611 and 616, resistor 606, HV current source 620, HV current sinks 640 and 645 and transistor stacks 621 and 622. Differential pair 600 has differential inputs 601 and 602 and is coupled to PMOS active load 635 to generate an output voltage at terminal 603. Transistor stacks 621 and 622 are similar to transistor stack 210 in FIG. 2 and each include N transistors. Current source 620 and current sinks 640 and 645 are HV current sources/sinks respectively similar to current source 350 in FIG. 3A and current sink 300 in FIG. 3 and each includes N transistors in their internal stacks in series with a respective current controlling transistor.

For the differential pairs 400 and 500 discussed with respect to FIGS. 4 and 5, the input common mode voltage cannot approach the negative supply voltage for proper differential pair operation since the two input transistors 410 and 411 cannot stay in the saturation region with a very low input common mode voltage. To allow for a low input common mode voltage, folded cascode pair 611 and 616 are shown in FIG. 6. NMOS cascode transistors 611 and 616 increase the output impedance of input transistor pair 610 and 615.

In a conventional folded cascode configuration, the gate terminals of the two NMOS cascode transistors are usually biased with a fixed bias voltage. However, if the gate terminal voltages are fixed, the source terminals of the cascode transistors can have a large voltage range due to changes in the differential pair input common mode voltage and their breakdown voltage limits may be exceeded. To solve this problem, the gate terminals of cascode transistors 611 and 616 are connected to the source terminals of input transistors 610 and 615 through resistor 606 such that the gate voltages (and also the source voltages) of the cascode transistors 611 and 616 also follow the input common mode voltage. Resistor 606 is used to provide a voltage drop such that the source voltages of the cascode transistors 611 and 616 are slightly higher than the input common mode voltage. As a result, when the input common mode voltage reaches the negative supply rail, there is still some voltage headroom for the two HV biasing current sinks 640 and 645 to operate properly.

Similar to the circuits shown in FIG. 4 and FIG. 5, two stacks of N transistors 621 and 622 are connected to the drain terminals of the cascode transistors 611 and 616 for HV operation. Instead of using a separate HV current source (that has an internal voltage divider/diode configuration) to control the gate voltages of the transistors in stacks 621 and 622, the voltage outputs of the voltage divider (similar to voltage divider 275 in FIG. 3A) and a diode (similar to diode 279 in FIG. 3A) configuration in current source 620 for the tail current of the differential pair 610 and 615 are used for controlling the N gate voltages of the N transistors in each of the stacks 621 and 622 via bus 623. Since the voltage divider and diode configuration in current source 620 detects the input common mode voltage change at the source terminals of input transistors 610 and 615 through resistor 606, current source 620 provides the proper gate voltage control for the transistors in stacks 621 and 622. Since the tail current source 620, is utilized for multiple purposes, less circuit components are required.

As was discussed with respect to FIGS. 4 and 5, the voltages across all of the transistors in differential pair 600 are protected from exceeding their respective breakdown voltages even when the ICMV approaches a high voltage supply voltage, which is multiple times larger than the breakdown voltage of the transistors in differential pair 600.

Figure 7:
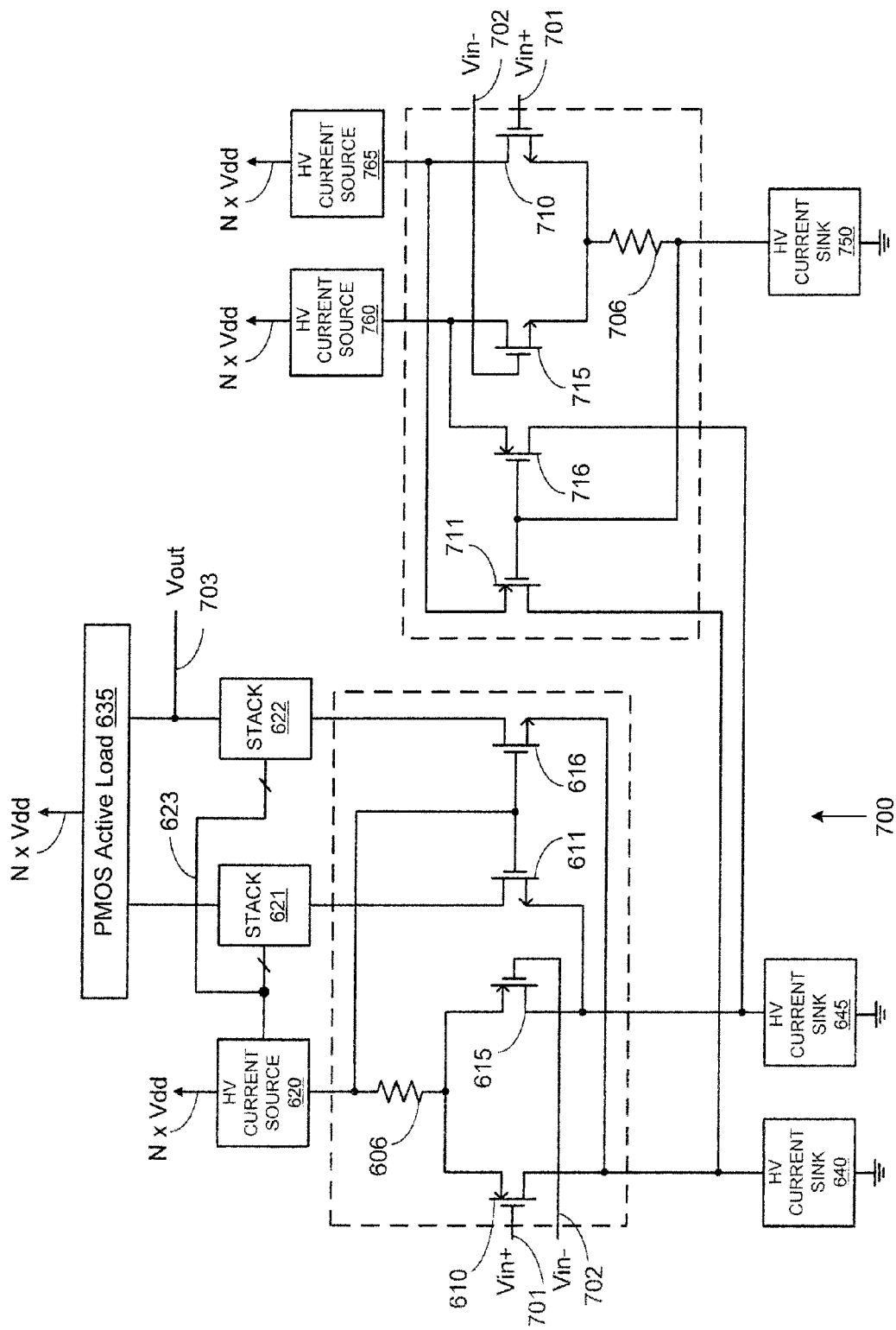
FIG. 7 shows a circuit diagram of a high voltage op amp using two high voltage differential pairs implemented in a low voltage process according to an embodiment of the present invention.

FIG. 7 shows a circuit diagram of a high voltage input stage 700 for an op amp using high voltage differential input pairs 605 and 705 implemented in a low voltage process according to an embodiment of the present invention. HV differential pair 605 is similar to HV differential pair 600 shown in FIG. 6 and includes PMOS input transistors 610 and 615, folded cascode NMOS transistors 611 and 616, resistor 606, HV current source 620, HV current sinks 640 and 645 and transistor stacks 621 and 622. Differential pair 605 has differential inputs 701 and 702 and is connected to PMOS active load 635. HV differential pair 705 includes NMOS input transistors 710 and 715, folded cascode PMOS transistors 711 and 716, resistor 706, HV current source 750, and HV current sinks 760 and 765. HV Differential pair 705 has differential inputs 701 and 702 and is coupled to PMOS active load 635. HV Input stage 700 generates an output voltage at terminal 703. Current source 750 and current sinks 760 and 765 are respectively similar to HV current source 350 in FIG. 3A and HV current sink 300 in FIG. 3 and each includes N transistors in their internal stacks in series with a respective current controlling transistor.

PMOS folded cascode differential stage 605 is combined with a HV NMOS folded cascode differential stage 705 as shown in FIG. 7 for realizing a differential input stage that can operate up to the positive (N×Vdd) supply voltage rail. HV PMOS differential stage 605 can handle very low input common voltages and HV NMOS differential stage 705 can handle very high input common voltages. The differential output current of the two differential stages 605 and 705 is combined together to generate the output voltage of the input stage 700 of an op amp. This is achieved by coupling the drain terminals of the cascode transistors 711 and 716 of differential stage 705 to the source terminals of the cascode transistors 611 and 616 of differential stage 605, as illustrated in FIG. 7. The differential current output from the NMOS cascode transistors 711 and 716 goes through the PMOS cascode transistors 611 and 616 and combines with the differential current output from the PMOS input transistors 610 and 615 to active load 630.

As was discussed with respect to FIGS. 4-6, the voltages across all of the transistors in input stage 700 are protected from exceeding their respective breakdown voltages even when the ICMV approaches a high voltage supply, which is multiple times larger than the breakdown voltage of the transistors in input stage 700.

Figure 8:
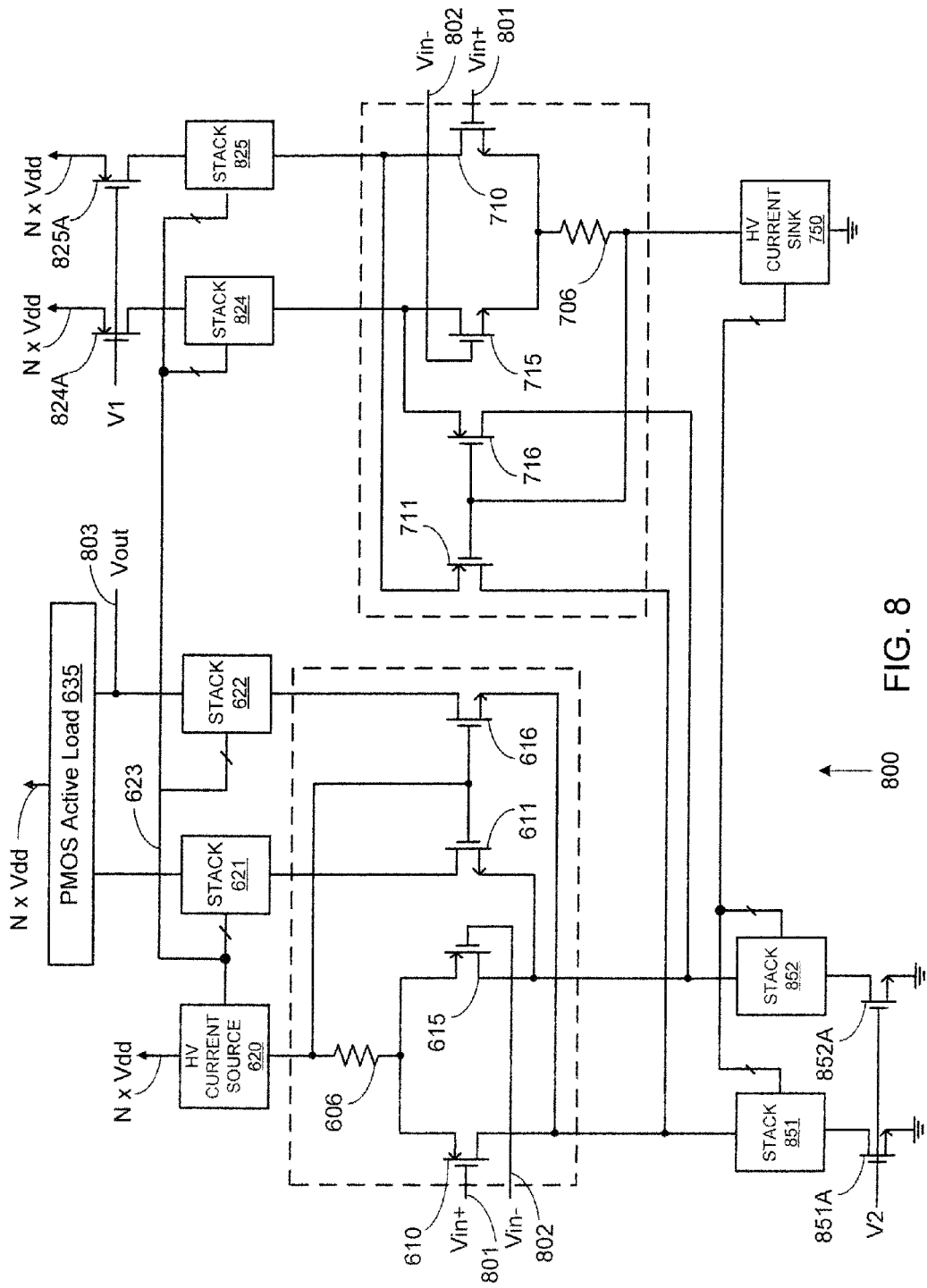
FIG. 8 shows a circuit diagram of a high voltage op amp using two high voltage differential pairs implemented in a low voltage process according to an alternate embodiment of the present invention.

FIG. 8 shows a circuit diagram of a high voltage input stage 800 for an op amp using high voltage differential pairs 805 and 807 implemented in a low voltage process according to an alternate embodiment of the present invention. HV differential pair 805 is similar to HV differential pair 605 in FIGS. 6 and 7. Differential pair 805 has differential inputs 801 and 802 and is connected to PMOS active load 635. HV differential pair 807 includes NMOS input transistors 710 and 715, folded cascode PMOS transistors 711 and 716, resistor 706, HV current source 750, and transistor stacks 824, 825, 851 and 852. HV Differential pair 807 is a modified version of HV differential pair 705, and has differential inputs 801 and 802. HV Input stage 800 generates an output voltage at terminal 803. Transistor stacks 824, 825, 851 and 852 are similar to stack 210 in FIG. 2 and each stack includes N transistors.

To reduce the number of required circuit components, the voltage divider and diode configuration internal to current source 620 can be used to replace the internal voltage divider and diode configurations in current sources 760 and 765 in FIG. 7, since they follow the same input common mode voltage changes and generate similar gate control voltages for their respective stacks of transistors. Current source 760 in FIG. 7 is replaced by stack 824 and transistor 824A in FIG. 8. Current source 765 in FIG. 7 is replaced by stack 825 and transistor 825A in FIG. 8. The N control voltages generated internally within current source 620 are connected to the gate terminals of the transistors in stacks 824 and 825 via bus 823.

Voltage V1 applied to the gates of transistors 824A and 825A sets the amount of current flowing through respective stacks 824 and 825.

In a similar fashion, the voltage divider and diode configuration internal to current sink 750 can be used to replace the internal voltage divider and diode configurations in current sinks 640 and 645 in FIG. 7, since they follow the same input common mode voltage changes and generate similar gate control voltages for their respective stacks of transistors. Current source 640 in FIG. 7 is replaced by stack 851 and transistor 851A in FIG. 8. Current source 645 in FIG. 7 is replaced by stack 852 and transistor 852A in FIG. 8. The N control voltages generated internally within current source 750 are connected to the N gate terminals of the N transistors in stacks 851 and 852 via bus 853. Voltage V2 applied to the gates of transistors 851A and 852A sets the amount of current flowing through respective stacks 851 and 852.

As was discussed with respect to FIGS. 4-7, the voltages across all of the transistors in input stage 800 are protected from exceeding their respective breakdown voltages even when the ICMV approaches a high voltage supply, which is multiple times larger than the breakdown voltage of the transistors in input stage 800.

Figure 9:
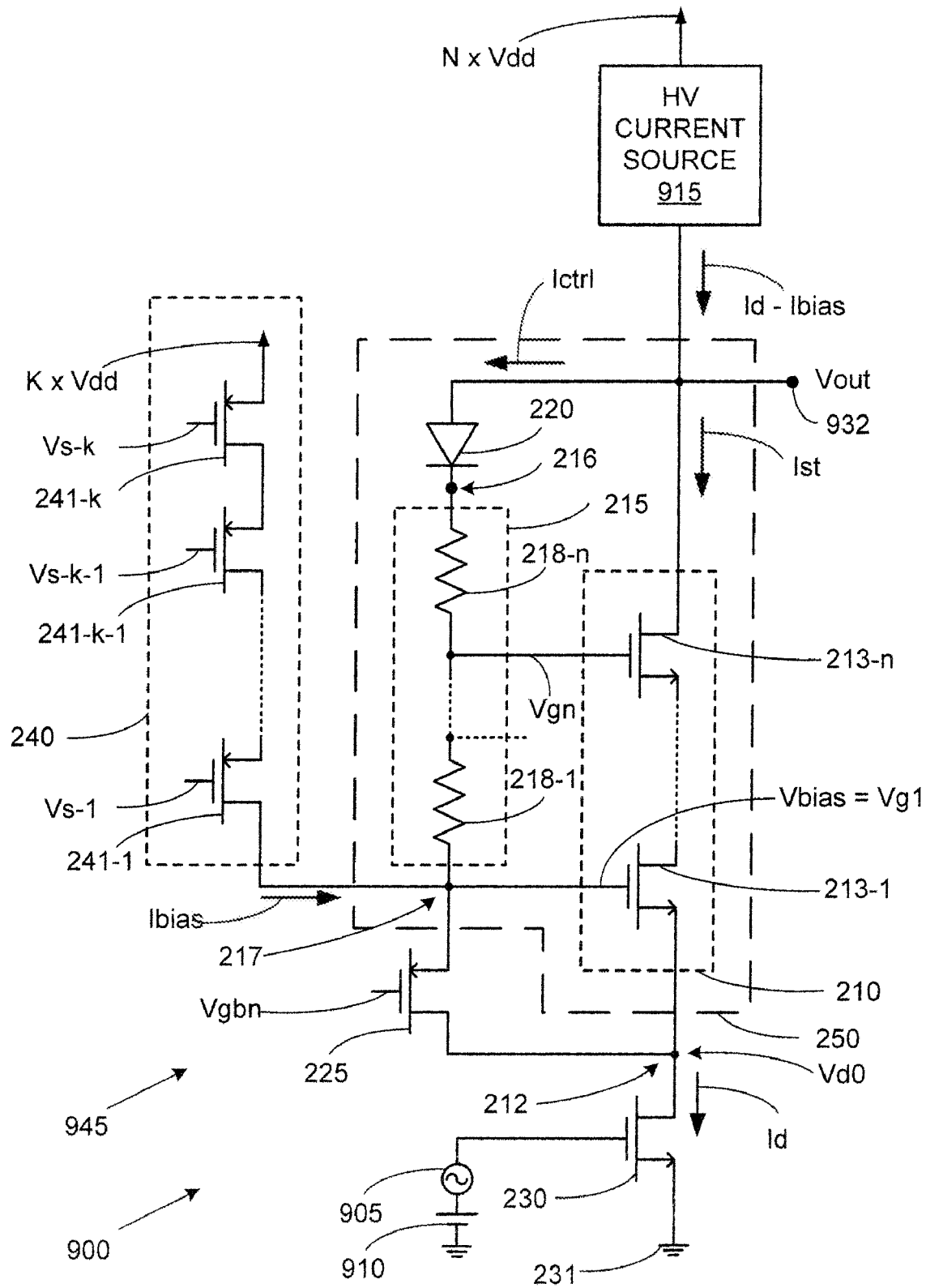
FIG. 9 shows a circuit diagram of a high voltage common source amplifier implemented in a low voltage process according to an embodiment of the present invention.

FIG. 9 shows a circuit diagram of a high voltage common source amplifier 900 implemented in a low voltage process according to an embodiment of the present invention. HV common source amplifier 900 includes HV current source 915 and HV current sink 945, with input voltage 905 and output voltage Vout at terminal 932. Current source 915 is similar to current source 350 in FIG. 3A. Current sink 945 is a modified version of current sink 300 in FIG. 3. A common source amplifier is usually used as the gain stage and/or the output stage of an op amp. By adding a high voltage current source 915 to the HV current sink 300 shown in FIG. 3, a HV NMOS common source amplifier can be realized as shown in FIG. 9. With a proper DC bias voltage 910, a small signal input voltage 905 can be injected to the gate terminal of NMOS transistor 230. The current Id changes according to the small signal input voltage and is converted to the output voltage Vout at 932 by the output impedance of the current source load 915 and the output impedance looking back at the NMOS transistor stack 250 and NMOS transistor 230. HV current source 915 and HV current sink 945 enable HV common source amplifier 900 to generate output voltages that are multiple times the breakdown voltages of the transistors in amplifier 900 without any of the voltages across the transistors exceeding their breakdown voltages and being rendered inoperative. A HV PMOS common source amplifier can also be realized based on the same principles except that all the NMOS transistors are replaced with PMOS transistors and vice versa.

The voltages across all of the transistors in HV common source amplifier 900 are protected from exceeding their respective breakdown voltages even when the output voltage approaches a high voltage supply rail, which is multiple times larger than the breakdown voltage of the transistors in input stage 900.

Figure 10:
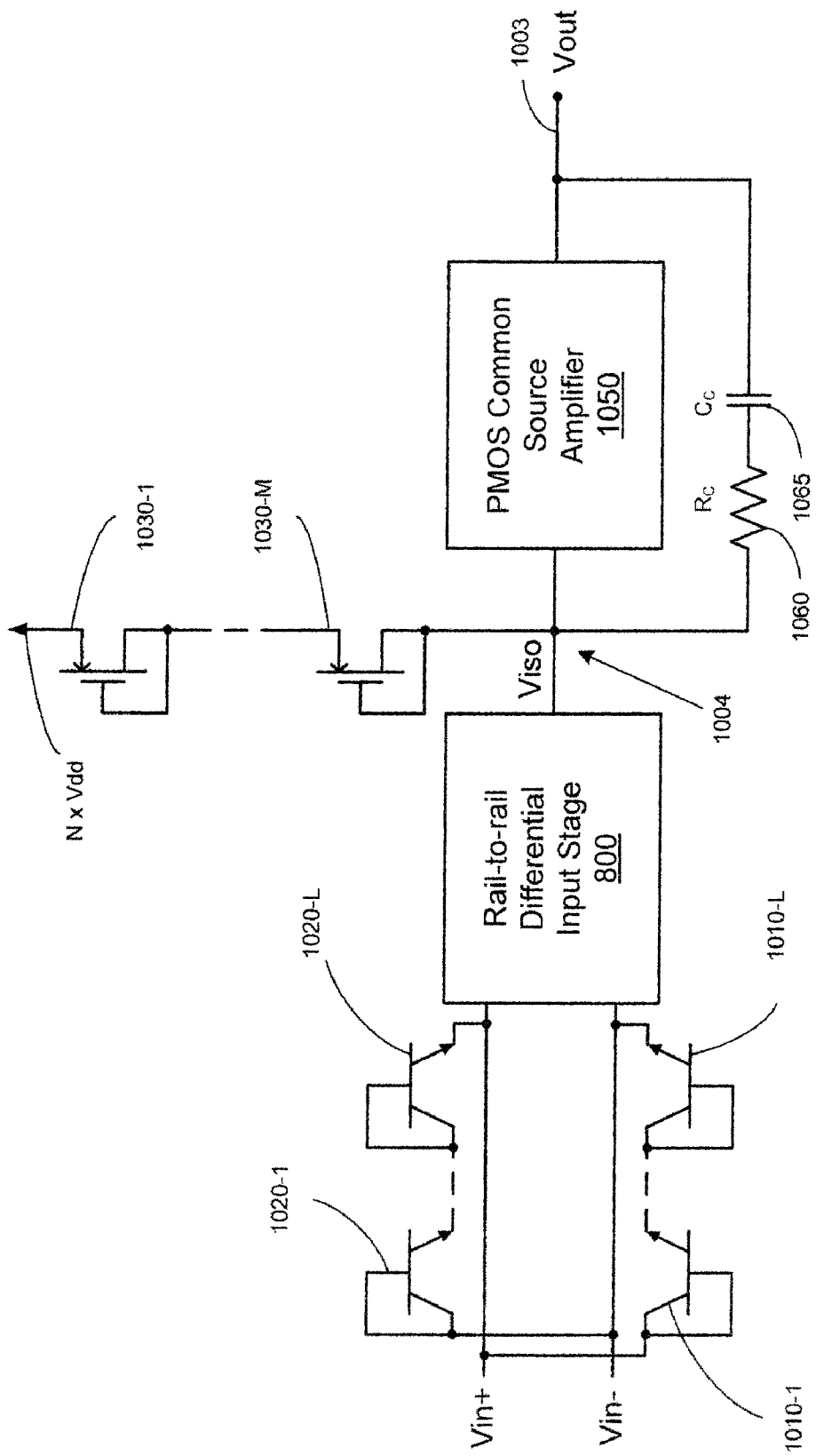
FIG. 10 shows a circuit diagram of a high voltage op amp implemented in a low voltage process according to an embodiment of the present invention.

FIG. 10 shows a circuit diagram of high voltage op amp 1000 implemented in a low voltage process according to an embodiment of the present invention. HV op amp 1000 includes HV differential input stage 800, PMOS common source amplifier 1050, diodes 1010-1 to L, 1020-1 to L, 1030-1 to M, resistor 1060 and capacitor 1065. HV op amp 1000 has differential inputs 1001 and 1002 and output 1003. PMOS common source amplifier 1050 is the PMOS equivalent of NMOS amplifier 900. A complete HV rail-to-rail op amp 1000 as shown in FIG. 10 can be realized using a HV rail-to-rail differential input stage 800 (with a PMOS active load) and a HV PMOS common source amplifier 1050 as the output stage of op amp 1000. Although an op amp is usually configured in negative feedback configuration such that the voltage difference between the positive input terminal and the negative input terminal of an op amp is usually very small, two sets of diodes or diode connected transistors (1010-1, . . ., 1010-L and 1020-1, . . ., 1020-L) are coupled between the positive and the negative input terminals of op amp 1000 to prevent large differential input voltages being applied to the op amp inputs. Using these diodes, the gate voltages of the input transistors of the op amp input stage 800 will not exceed the breakdown voltage limit.

When the differential input signal is very large and the voltage gain of the input stage 800 is large, the output voltage Viso at node 1004 of input stage 800 may have a very large voltage swing, which can be large enough to exceed the breakdown voltage limit for the input transistor of the PMOS common source amplifier 1050. To limit this voltage swing, a number of diode connected transistors (1030-1, . . ., 1030-M) are connected to the output 1004 of HV input stage 800. In general, an op amp may also contain a number of stages. To prevent instability, compensation is required. As illustrated in FIG. 10, resistor 1060 and capacitor 1065 are used for compensating this two-stage HV rail-to-rail op amp 1000.

HV input stage 800 provides op amp 1000 with a wide range ICMV and HV output amplifier 1050 provides op amp 1000 with a HV output voltage range. The voltages across all of the transistors in HV op amp 1000 are protected from exceeding their respective breakdown voltages even when the output voltage approaches the high voltage supply rails, which is multiple times larger than the breakdown voltage of the transistors in op amp 1000.

In alternate embodiments, the high voltage differential pairs and high voltage op amps of the present invention described herein can be made of bipolar junction transistors. In all of these various operational configurations, the voltages across the different terminals of all the transistors are less than the breakdown voltage of the respective transistors.

Although the preceding description describes various embodiments of the system, the invention is not limited to such embodiments, but rather covers all modifications, alternatives, and equivalents that fall within the spirit and scope of the invention. Since many embodiments of the invention can be made without departing from the spirit and scope of the invention, the invention resides in the claims hereinafter appended.

I claim:

1. A high voltage (HV) differential pair implemented in a low voltage process, comprising:
   a differential pair of PMOS transistors having their gates coupled to a pair of differential input voltages;
   a HV current source coupled to a common source node of the differential pair; wherein the HV current source comprises a first plurality of stacked PMOS transistors and a first voltage divider in series with a first diode;
   a first and second plurality of stacked transistors coupled to the outputs of the differential pair; and
   a HV current sink coupled to the common source node of the differential pair; wherein the HV current sink comprises a first plurality of stacked NMOS transistors and a second voltage divider in series with a second diode;
   wherein the second voltage divider generates a plurality of voltages, and each of the plurality of generated voltages is coupled to a respective gate of the first and second pluralities of stacked transistors.

2. The high voltage differential pair of claim 1, wherein the input common mode voltage coupled to the input of the differential pair can be larger than the breakdown voltages of the transistors of the differential pair, and the voltage across any transistor of the differential pair will be less than the breakdown voltage of the respective transistor.

3. The high voltage differential pair of claim 1, wherein the HV current sink follows the input common mode voltage change coupled to the differential pair.

4. The high voltage differential pair of claim 1, and further comprising:
- a first NMOS cascode transistor coupled between a drain terminal of a first transistor of the differential pair and the first plurality of stacked transistors;
- a second NMOS cascode transistor coupled between a drain terminal of a second transistor of the differential pair and the second plurality of stacked transistors; and
- a transistor configured as a diode coupled between the common source node and a node coupled to the gates of the first and second cascode transistors and the HV current sink.

5. The high voltage differential pair of claim 1, wherein the first voltage divider comprises a first plurality of series coupled resistors and the second voltage divider comprises a second plurality of series coupled resistors.

6. The high voltage differential pair of claim 1, wherein the first and second plurality of stacked transistors comprise PMOS transistors.

* * * * *